United States Patent [19]
Marek

[11] Patent Number: 4,536,693
[45] Date of Patent: Aug. 20, 1985

[54] HIGH-SPEED CAPACITOR DISCHARGE CIRCUIT SUITABLE FOR THE PROTECTION OF DETONATION DEVICES

[75] Inventor: Albert J. Marek, Dallas, Tex.

[73] Assignee: LTV Aerospace and Defense Company, Dallas, Tex.

[21] Appl. No.: 414,105

[22] Filed: Sep. 2, 1982

[51] Int. Cl.³ .............................................. H02J 15/00
[52] U.S. Cl. .......................................... 320/1; 307/31;
307/140; 307/141; 102/218
[58] Field of Search ..................... 320/1; 323/349, 351;
307/108, 109, 139, 140, 141, 31; 315/209 CD;
102/202.1, 218, 220

[56] References Cited

U.S. PATENT DOCUMENTS

| | | | |
|---|---|---|---|
| 3,217,310 | 11/1965 | Pearson et al. | 320/1 |
| 3,474,291 | 10/1969 | Kallage | 315/209 CD |
| 3,538,414 | 11/1970 | Janoski | 320/1 |
| 3,564,278 | 2/1971 | Robbins | 307/108 |
| 3,629,622 | 12/1971 | Denenberg | 323/284 |

Primary Examiner—William H. Beha, Jr.
Assistant Examiner—Jeffrey Starratt
Attorney, Agent, or Firm—J. M. Cate; S. S. Sadacca

[57] ABSTRACT

A circuit for providing controlled switching of power applied to a load is adapted for actuating and deactivating a power switching circuit in response to a command signal. The circuit employs a switching circuit having a time delay section operable to terminate application of power immediately upon the cessation of a control signal and to conduct current after a predetermined delay interval after receipt of a command signal. The circuit is adapted for use with pyrotechnic ignition systems in which it is desired to quickly discharge capacitive elements connected to a load for prevention of undesired and possibly hazardous build-up of heat in a resistive ignition element.

15 Claims, 4 Drawing Figures

HIGH-SPEED CAPACITOR DISCHARGE CIRCUIT SUITABLE FOR THE PROTECTION OF DETONATION DEVICES

TECHNICAL FIELD

The present invention relates to capacitor discharge circuits and, more particularly, to a capacitor discharge circuit for quickly discharging a capacitor, suitable for embodiment in pyrotechnic ignition systems and the like for preventing accidental discharge.

BACKGROUND ART

A variety of capacitor discharge circuits has been employed in prior-art systems. Discharge circuits are used to remove an electrical charge from a capacitor when power to the capacitor is turned off. Conventional, prior-art circuits utilize a "bleed" resistor connected in parallel with the capacitor to be discharged. While this simple circuit effectively discharges the capacitor, the time duration for discharge can be undesirably long in applications requiring large capacitors. Furthermore, certain circuit applications, such as circuits employed for detonating a pyrotechnic device, require substantially instantaneous discharge times, which are not practicably obtainable with "bleed" resistors, for preventing accidental triggering of the explosive load by voltage accumulation in the circuit's capacitive elements. The low value of resistance required for a bleed resistor to accomplish rapid capacitor discharge results in low operating efficiency when power is being applied to the capacitor, and may not provide sufficient protection against undesired voltage accumulation.

One solution to this problem is to utilize the avalanche characteristics of a Zener diode. This approach is used in U.S. Pat. No. 3,100,269, issued Aug. 6, 1963 to D. T. Barry, which discloses a quick acting gate for voltage or current discharge. The avalanche effect is achieved by applying a reverse voltage equivalent to the Zener diode's breakdown voltage, resulting in its reverse bias of the diode, and thus providing a low impedance current path through which the capacitor is discharged. However, such a circuit requires a means for biasing the Zener diode to maintain a non-conducting state during normal circuit operation, as well as circuit means for providing a trigger pulse, i.e., the voltage necessary to cause breakdown of the Zener diode. This double source requirement adds to the cost and complexity of the circuit.

Other proposed means for rapid discharge of a capacitive load include the use of a transformer which, upon some determinative change in the primary circuit's current flow, causes current to flow through the secondary circuit, thus triggering a semiconductor which acts as a current path through which the capacitive load is discharged. Again, such circuits are undesirably complex and expensive. There is, thus, a need for an efficient, inexpensive rapid discharge circuit having no peripheral triggering power source or device added to the primary circuit.

An object of the invention is to provide a protective circuit for preventing undesired accumulation of voltage in capacitive elements of time delayed detonation circuits.

A further object of the invention is to effectively isolate a detonation circuit from a commonly shared, multiple purpose power source to prevent intermittent pulse signals generated by the power source from inducing an accumulation of charge in capacitive elements of the detonation circuit.

DISCLOSURE OF THE INVENTION

This invention provides a discharge circuit which, in one embodiment, is employed in a switching circuit which is responsive to electrical pulses of variable duration and magnitude, being designed to selectively energize an electrically actuatable load. In one embodiment, a time delay circuit is employed in conjunction with a circuit for providing automatic and rapid discharge of stored energy. The time delay device establishes a minimum triggering threshold by preventing electrical pulses of undesirably or predetermined short duration and magnitude from energizing the electrically actuatable load. In the preferred embodiment, a capacitive element discharging device disperses undesirable, accumulated electrical charge from a capacitive element located in the time delay device.

It is, accordingly, a major object of this invention to provide a switching circuit operable to transition from an open condition to a closed condition in response to a command signal of predetermined characteristics.

Another object is to provide such a switching circuit which is operable to switch to a closed condition in response to a command signal of a predetermined power level integrated over time.

A further object is to provide such a switching circuit which is operable to transition from an open to a closed condition in a delayed response subsequent to the reception of a command signal, and to transition from a closed condition to an open condition substantially immediately upon cessation of the command signal.

It is a further object of the present invention to provide a means for rapidly discharging a capacitive load suitable for use in a switching circuit having a delayed response to external command signals.

It is also an object of the invention to provide an economical means for rapidly discharging a capacitive load, employing a minimum number of components.

Another object of the invention is to provide an automatic means, for rapidly discharging a capacitive load, which requires no peripheral triggering power source incorporated within the discharge circuit.

Yet another object of the invention is to provide a highly efficient means for rapidly discharging capacitive elements by utilizing the switch-like characteristics of a transistor when appropriately biased.

BRIEF DESCRIPTION OF THE DRAWINGS

Further objects and advantages of the invention will become apparent from the following description and claims and from the accompanying drawings, wherein:

DETAILED DESCRIPTION OF THE INVENTION

Figure 1:
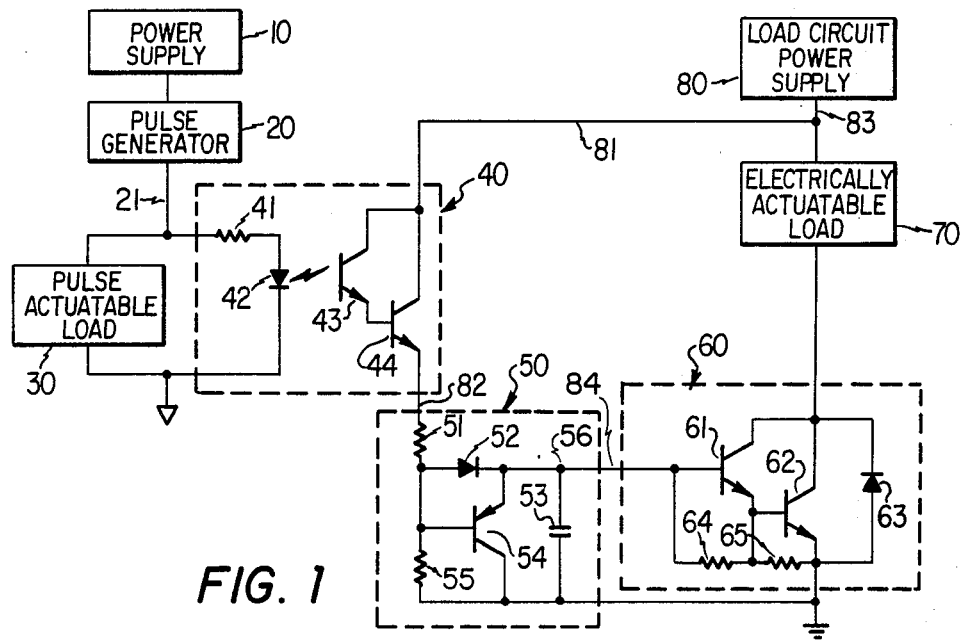
FIG. 1 is a schematic diagram showing a preferred embodiment of the present invention.

Referring now to the drawings in detail wherein like numerals indicate like elements throughout the several views, the capacitor discharge circuit 50 comprises a means for rapidly discharging a capacitor 53 when a command signal, received from a command control switching circuit 40, is terminated. The capacitor 53 may, for example, constitute a filtering capacitor connected across the direct current output terminals of a power supply, not shown, wherein discharge of the capacitor upon cessession of operation is desired to prevent undesired residual charge within the circuit. In the preferred embodiment illustrated in FIG. 1, the capacitive discharge circuit is employed in association with a load current control switching circuit 60. The command control circuit 40 is connected in series with the capacitor discharge circuit 50 which is operably connected in series with portions of the load current control switching circuit 60. These circuit portions will be described in more detail hereinbelow; in summary, however, an electrically actuatable load 70 is connected in series between the load current control switch 60 and a load circuit power source 80, the switching circuit 60 being operable to control the flow of current from the power source 80 to ground. Command control circuit 40 is connected, by leads 81 and 82, in parallel with the circuit from power source 80, through load 70 and current control switching circuit 60.

The capacitor discharge circuit 50, as will be understood from the following description, serves to actuate the load current control switching circuit 60 in response to signals received through command control circuit 40 actuated by a pulse generator 20 and a control power supply 10, as will be more fully understood from the description hereinbelow. With continued reference to FIG. 1, the load 70, in the present, exemplary embodiment, includes a resistive squib and associated pyrotechnic device which is detonated by the resistive element upon the application of current from power supply 80.

The control power supply 10 is connected in series with a pulse generator 20 and a pulse actuated load 30. The pulse actuated load 30 may in avionic circuits, per example, typically comprise further solid state switching modules connected in parallel with command control circuit 40. In aerospace applications, it is desired for weight reduction, to minimize the number of leads and cables extending between various portions of the aircraft, and a single lead 21, and corresponding ground lead, are thus employed for transmitting test and command signals to several circuit elements. The pulse generator 20 is of the type, commonly used in the art, in which the frequency and amplitude of the generated waveform can be automatically regulated to provide variations ranging from a distinctly pulsating waveform to a continuous output of voltage and current. Connected in parallel with the pulse actuable load 30 is the command control switch circuit 40 which, in combination with switching circuit 60, comprises means for selectively controlling power applied to the load 70, which in the present embodiment comprises the electrically actuatable load 70, as will be more fully understood from the description below. The command control circuit 40 includes a current limiting resistor 41 connected to the cathode of a light emitting diode (LED) 42 which acts upon a photosensitive switch 43 connected in a Darlington pair configuration by its emitter to the base of a transistor 44 and by its collector to the collector of transistor 44. The emitter of transistor 44 is connected by lead 82 in series with the capacitor discharge circuit 50, which comprises a resistor 51, connected in series with a diode 52. A p-n-p transistor 54 is connected to the diodes 52, with the diode being forward-biased and connected between the transistor's base and emitter. The transistor 54 has a biasing resistor 55 connected between the transistor's base and its collector. A capacitor 53 is connected in parallel with the emitter-collector circuit of transistor 54. The node 56, representing the junction of diode 52, the transistor 54 emitter and the capacitor 53, is the point of connection between the capacitor discharge circuit 50 and the load current control switching circuit 60. More specifically, it is connected to the base of an n-p-n transistor 61. Transistor 61 is connected in a Darlington pair configuration by its emitter to the base of an n-p-n transistor 62, and by its collector to the collector of transistor 62. A first biasing resistor 64 is connected between the base and emitter of transistor 61, while a second biasing resistor 65 is similarly connected to transistor 62. A diode 63 is connected in parallel with transistor 62, with the diode's anode connected to the transistor's collector and its cathode connected to the transistor's emitter. The electrically actuatable load 70 is connected in series with switching unit 60, at the junction of the collectors of the two transistors 61 and 62, and the cathode of diode 63. Power source 80 is connected to the load 70 by lead 83 and to the command control circuit 40 by lead 81.

Upon application of a command signal voltage from the power supply 10, as converted by the pulse generator 20, current is passed through the current limiting resistor 41 and across LED 42, causing the diode to glow. The light thusly emitted is detected by photosensitive switch 43. Switch 43 is turned on, permitting it to conduct current through its collector-to-emitter junction, resulting in the application of voltage to the base of transistor 44 to cause it to turn on and act as a closed switch, permitting current from load circuit power supply 80 to flow through its collector-emitter circuit. A time delay factor is provided by the operation of the capacitor discharge device 50, related to the component values of resistor 51 and capacitor 53. The time constant derived from the multiplication of the component values of resistor 51 and capacitor 53, multiplied by a factor of five, represents the time interval required to cause the voltage level in capacitor 53 to rise until the capacitor is substantially fully charged to the level of the applied voltage. Diode 52 is forward-biased, causing a voltage drop of about 0.6 volts to occur thereacross. This voltage drop "back-biases" transistor 54, since the voltage at the base of the transistor is held 0.6 volts higher than the voltage at the emitter, causing transistor 54 to be maintained in a non-conductive state as long as current continues to flow through diode 52. Once the signal transmitted by power supply 10 to the command control circuit 40 is interrupted, transistor 44 is turned off, which interrupts current flow through diode 52. The voltage charge which has accumulated at capacitor 53 cannot pass through the reverse-biased diode 52, but is conducted to the emitter of p-n-p transistor 54. This voltage accumulation causes a small amount of voltage to trickle through the emitter-to-base junction and, because of the presence of base biasing resistor 55, results in the emitter-to-collector junction of transistor 54 becoming forward-biased. Once forward-biased, the transistor acts as a direct connection to ground with respect to the charge which had accumulated at capacitor 53, and the charge is rapidly removed from the capacitor, dropping the potential at the base of transistor 61. The emitter-to-collector junction of transistor 54 then reverts to a non-conductive state and the circuit resumes its normal operational status.

This unique arrangement of diode 52 connected between the base and emitter junctions of transistor 54, and capacitor 53 connected across the emitter-to-collector circuit, wherein diode 52 is oriented with its anode connected to the base of transistor 54, permits substantially instantaneous switching of the transistor 54 (to an on condition) in response to the higher potential at its emitter relative to that at its base, from the charge on capacitor 53. Note that the transistor is safely actuated despite the termination of its previous operating voltage from command control circuit 40; i.e., transistor 54 is actuated by an internal power source (i.e., the residual charge on capacitor 53) independently of external power sources. Thus, when the capacitor discharge circuit 50 is, alternatively, employed in a power supply circuit (wherein capacitor 53 is a filtering capacitor connected across the DC outputs of a full-wave rectification power supply, and wherein switching circuit 60 is not employed), the capacitor discharge circuit is operable to discharge capacitor 53 despite the fact that all power to the power supply unit is cut off.

Referring specifically to the embodiment of FIG. 1, when transistor 44 remains in a conductive state for a sufficient period of time relative to the time constant of resistor 51 and capacitor 53, the voltage applied to the load current control switch circuit 60 (the principal components being two transistors 61 and 62 arranged in a Darlington pair configuration) becomes sufficient to turn on switching circuit 60. The voltage at the non-grounded side of the charged capacitor 53 is applied through lead 84 to the base of transistor 61, causing it to conduct current through its collector-emitter junction, resulting in an application of voltage at the base of transistor 62 sufficient to cause it to conduct current as if it were a closed switch, permitting current to flow from the load circuit power source 80, through the electrically actuatable load 70, through the current control switching circuit 60, to ground. Resistors 64 and 65 act as biasing elements to maintain proper operation of the switch function of the Darlington pair transistors 61 and 62.

The configuration of components including elements 61 and 62 and described inclusively as the "load current control switching circuit" 60 is commonly referred to in the art as a "Darlington switch." Such circuits are readily available as integrated circuits, such as that available from the Motorola Co. as part number 2N6357. The configuration referred to herein as the "Command Control Switching Circuit" 40 is commonly referred to in the art as an "optical isolator" switch. Such devices are available as integrated circuits, such as that available from the General Electric Company as part number H11B255.

The circuit of FIG. 1 is particularly adapted to provide rapid discharge of capacitor 53 for quickly actuating (turning off) the switching circuit 60 to prevent buildup of heat in the load 70 upon power of too great a heat inducing value being conducted from power supply 80. Thus, capacitor 53, when in its uncharged state, acts as a conductor to shunt intermittent negligible signals, from command control circuit 40, to ground. When the charge upon capacitor 53 builds up as a continuous signal is applied, through lead 82, the potential at terminal 56 and at the base of transistor 61 increases until the threshold value of transistor 61 is reached, turning transistors 61 and 62 on, applying power to the load 70. This delay between the application of a control signal from command control circuit 40 and the switching on of switching circuit 60, as previously described, in substantially governed by the RC time constant of resistor 51 and capacitor 53 relative to the voltage level applied over a given period. Because the capacitor 53 acts as an integrator, the circuits 50 and 60 may be termed a means for conducting current to a load in response to the reception of a command signal, integrated overtime, of a predetermined value, if minor component leakages are ignored.

The delay time is selected to prevent actuation of switching circuit 60 during the application of intermittent test pulses, generated by power supply 10 and pulse generator 20, but to effect switching, to actuate the pyrotechnic device, upon the application of a continuous command signal. As discussed above, capacitor discharge circuit 50 operates substantially instantaneously (e.g., in about 5 microseconds) to turn switching circuit 60 off upon the cessession of the control signal. Thus, residual heat buildup in the resistive load subsequent to the application of a control signal is eliminated.

The quick discharge of capacitor 53 is obviously of particular importance when the circuit is employed with an explosive pyrotechnic device, wherein leakage of spurious signals into the load 70 could be critically dangerous. The circuit is also applicable when other types of loads 70 are employed, when it is desired to introduce a delay in the response of switch circuit 60 upon the application of a command signal along lead 82, and when it is desired to then transition current control switch to a non-conductive state with no delay, i.e., immediately upon the termination of the command signal. The capacitive discharge circuit is useful in certain power supply circuits, as discussed above, wherein it is desired to discharge large capacitors, after terminating applied power, for the prevention of hazardous residual charge. Another application is in the field of air conditioning control circuitry wherein it is desired to delay operation of a relay for operating a compressor unit upon the application of a command signal, but wherein it is desired to immediately turn off the compressor upon termination of the command signal. Further, variously responsive switching devices with loads, configured in alike manner to those of circuits 50, 60 and load 70 in FIG. 1, could be connected in parallel with the power source 80 and the command control circuit 40. These variously responsive switching devices could be adjusted by the time delay components of the respective capacitor discharge circuits to differing sensitivities causing each of the associated loads to be energized at different points in time. The circuits could be adjusted to be responsive to preselected frequencies of given voltages of control signals (which are typically square wave generators, or sinusoidal power supplies) or to be responsive substantially only to constant current signals, assuming the voltage of the signals remains constant.

The capacitor discharge circuit 50 may also be employed, for example, in association with circuit applications, other than the switching circuit 60, wherein it is desired to quickly discharge a capacitive charge. For example, the transistor 54 may be connected in parallel with a capacitor (not shown) which constitues a filtering circuit connected across the output of a power supply, wherein the capacitor serves to filter out changes in voltage level of a full-wave rectified output. In prior-art power supplies, as discussed above, the discharge of such filtering capacitors is typically accomplished by a bleed resistor connected across the filter capacitor, with resultant delays in discharge of the capacitors upon termination of power and undesirable continuous power consumption by the bleed resistor.

Figure 2:
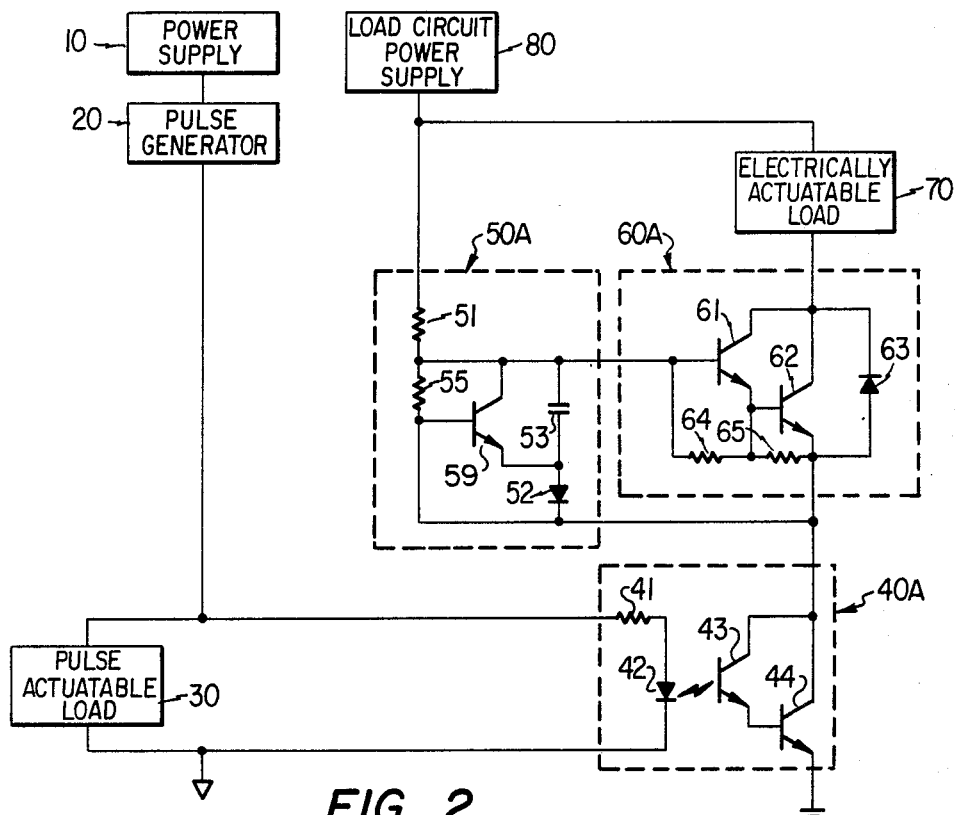
FIG. 2 is a schematic diagram of an alternative embodiment employing a ground control circuit for use in low current applications.

Referring to FIG. 2, in another embodiment of the invention adapted to provide ground switching capability in low current applications, the ground path rather than the power path is controlled by the optical isolator circuit 40A. The p-n-p transistor (FIG. 1) 54 employed in the high speed capacitor discharge circuit 50 of FIG. 1 is suitably replaced with an n-p-n transistor 59, (FIG. 2) in the circuit configuration of FIG. 2. The discharge circuit components of the embodiment of FIG. 2 are in the same relational configuration as their FIG. 1 counterparts, with the base biasing resistor 55 connected between the transistor's base and collector, and diode 52 being connected between the transistor's emitter and base to maintain a voltage potential which prevents transistor 59 from conducting, since its base-to-emitter junction is reverse biased because of the voltage drop through the diode. When current stops flowing through circuit 50A due to its disconnection from ground by circuit 40A, the accumulated voltage charge of capacitor 53 is discharged through base biasing resistor 55, which has a smaller resistance value than resistor 51. This causes a voltage accumulation at the base sufficient to turn on the transistor and to forward-bias the collector-to-emitter junction of transistor 59, creating a conductive path across the capacitor to drain the the accumulated charge at capacitor 53, thereby rapidly removing the voltage from the capacitor.

Figure 3:
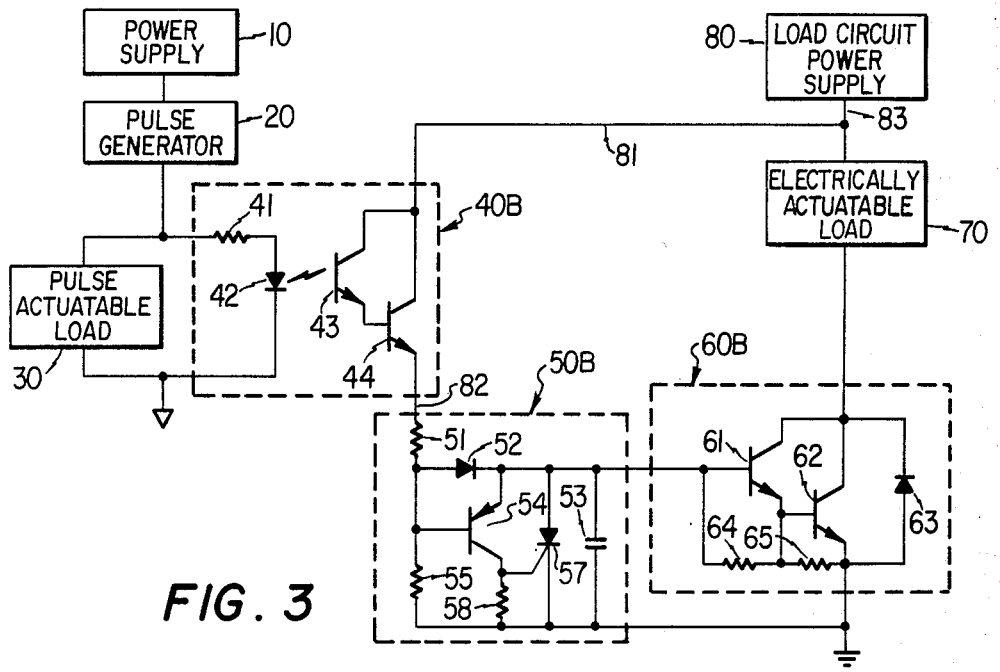
FIG. 3 is a schematic diagram of a modification of the invention illustrated in FIG. 1, adapted for use in high current applications.
Figure 4:
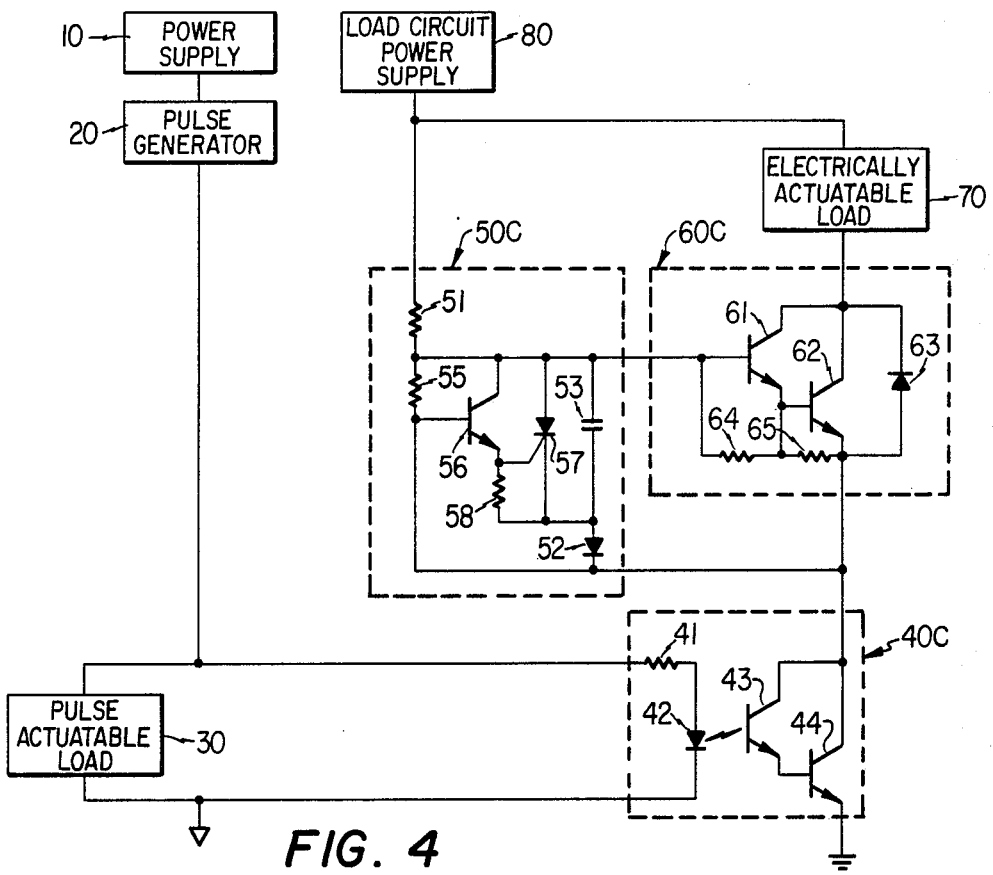
FIG. 4 is a schematic diagram of a modification of the invention illustrated in FIG. 2, adapted for use in moderately low current applications.

Referring to FIG. 3, to enable the circuit to be used in power applications requiring the discharge of very large capacitors, a silicon controlled rectifier (SCR) 57 and a gate biasing resistor 58 are added to the previously described embodiments of the invention. In the embodiment of FIG. 3 the anode-to-cathode path of SCR 57 is connected in parallel with both capacitor 53 and p-n-p transistor 54, with the gate of the SCR connected to the collector of the transistor. The gate biasing resistor 59 is located between the gate-collector connection and ground. With this configuration, when transistor 54 is made conductive through its emitter-to-collector path, the gate biasing resistor 58 creates a voltage rise at the gate of the SCR 57 which causes the SCR anode-to-cathode path to conduct, acting as a direct connection to ground. Since SCR 57 is able to handle more power than transistor 54, the transistor is not subjected to damage as capacitor 53 is discharged. A similar embodiment is illustrated in FIG. 4 for use in moderately low current ground control applications.

The above described detonation circuits are illustrative of applications in which the high-speed capacitor discharge circuit is employed in conjunction with switching and power circuits having various loads to provide selective triggering of loads sharing a common, pulsating control signal and insuring automatic and continuous prevention against undesired or accidental triggering of a load.

As was suggested with reference to the embodiment of FIG. 1, the circuit provides a means for quickly discharging a capacitor upon the termination of an applied command signal, e.g., the command signal generated by command control circuit 40. When the capacitor discharge circuit 50 is associated with a switching circuit and load such as the switching circuit 60 and load 70, the operation of the switching circuit 60 in response to command signals from circuit sections 10, 20 and 40 permits the safe employment of a single pulse generator, power supply, and lead 21 for multiple loads 30 and 40 without danger of an inadvertant buildup of heat in the load 70. Such safety provisions, as has been previously mentioned, are of critical importance with respect to pyrotechnic devices and are advantageous with respect to other applications.

Various improvements, modifications and alternative applications and uses will be readily apparent to those of ordinary skill in the art. Accordingly, the scope of the present invention should be considered in terms of the following claims and is not to be limited to the details of the illustrative embodiments shown in the specification and drawings.

What is claimed is:

1. A circuit for selectively energizing an electrically actuatable load, comprising:
   a source of electrical power, a load, and a switching circuit connected in mutual series;
   signal generating means for generating command signals
   control means, coupled to the signal generating means and the switching circuit, for actuating the switching circuit upon reception from the signal generating means, of a command signal having a predetermined value over time, and for deactivating the switching circuit upon the termination of a command signal, the control means having internal power storage means for storing energy received from the signal generating means and for actuating the control means upon termination of a command signal from the signal generating means.

2. The circuit of claim 1, wherein the control means is connected in series between the signal generating means and the switching circuit and comprises means for actuating the switching circuit upon the reception of a command signal, integrated over time, exceeding a predetermined level.

3. The apparatus of claim 2, wherein the control means is connected in series between the signal generating means and the switching circuit, the internal storage means comprising a capacitor having one terminal connected to receive command signals, and means, connected in parallel with the capacitor, for preventing discharge of the capacitor during reception of a signal from the command signal source and for effecting discharge of the capacitor and deactivation of the switching circuit upon termination of the command signal.

4. The apparatus of claim 3, wherein the means for effecting discharge of the capacitor comprises a transistor having its emitter collector circuit connected in parallel with the capacitor, and a diode having its anode connected to the base of the transistor and its cathode connected to the emitter of the transistor.

5. A circuit for storing electrical charge in response to a command signal from a current source, and for rapidly dissipating electrical charge upon termination of the command signal, comprising:
   first, capacitive storage means for receiving and storing electrical energy from the command signal source;

second means, connected in parallel with the first means, for preventing discharge of the capacitive storage means during reception of a signal from the command signal source and for effecting discharge of the capacitive storage means upon termination of the command signal, the first means comprising means for storing power for actuating the second means upon termination of the command signal.

6. The apparatus of claim 5, wherein the second means comprises a transistor, and a diode connected between the emitter and the base of the transistor.

7. A circuit for selectively energizing an electrically actuatable load, comprising:
(a) first means, for receiving electrical signals from a signal source;
(b) second means, for preventing any of said electrical signals, below a predetermined value over time, from energizing the electrically actuatable load, and for applying an actuating voltage to energize the load upon reception of electrical signals above the predetermined value over time, the second means comprising a capacitive element; and
(c) third means, for automatically and rapidly dispersing undesirable, accumulated charge from the capacitive element upon termination of an electrical signal, the second means comprising means for storing energy received from the signal source and for applying said energy to the third means for actuating the third means upon termination of an electrical signal from the signal source.

8. A circuit in accordance with claim 7, comprising a fourth means for generating electrical signals and for applying the signals to the first means, 9. A circuit for selectively energizing a load, comprising
(a) first means, for receiving electrical signals from a signal source;
(b) second means, for preventing electrical signals, below a predetermined value over time, from energizing the load, and for applying an actuating voltage to energize the load upon reception of electrical signals above the predetermined value over time, the second means comprising a capacitive element;
(c) third means, for automatically and rapidly dispersing undesirable, accumulated charge from the capacitive element upon termination of an electrical signal; and
(d) fourth means for generating electrical signals and for applying the signals to the first means, wherein at least two loads, within respective load circuits in mutually parallel connection, are provided, each load circuit comprising means associated with the pulse generating means.

10. A circuit in accordance with claim 9:
(a) wherein said first means comprises a fifth means, for electrically isolating the load circuits, the fifth means having a current control switch for regulating current flow within at least one of the load circuits in relation to applied electrical signals;
(b) further comprising power supply means for applying power to the load within at least one load circuit; and
(c) sixth means, associated with the second means, for controlling current flow through the load associated with the power supply means in response to actuating voltage from the second means.

11. A circuit in accordance with claim 10, wherein said isolating means is an optical isolator which comprises:
(a) a current limiting resistor;
(b) a light emitting diode, connected in series with the current limiting resistor, which is actuatable by electrical signals from the signal source; and
(c) a photosensitive switch, which is associated with and actuatable by the light emitting diode, having a first transistor, a second switching transistor being provided connected in a Darlington pair configuration to the base of the first transistor, 12. A circuit in accordance with claim 10, wherein said sixth means comprises:
(a) a pair of transistors connected in a Darlington pair configuration, each transistor having a biasing resistor connected across its emitter-to-base junction; and
(b) a reverse-biased diode connected in parallel with the Darlington pair transistors across the collector-to-emitter junctions of the transistors.

13. A circuit for selectively energizing at least two loads in parallel configuration, comprising:
(a) first means, for receiving electical signals from a signal source;
(b) second means, for preventing any of said electrical signals, below a predetermined value over time, from energizing the electrically actuatable loads, and for applying an actuating voltage to energize the loads upon reception of electrical signals above the predetermined value over time, the second means comprising a capacitive element; and
(c) third means, for automatically and rapidly dispersing undesirable, accumulated charge from the capacitive element upon termination of an electrical signal, wherein the second and third means are interconnected and comprise:
(d) a resistor and a capacitor connected to provide an R-C time delay, having component values designed to accumulate an electrical charge in the capacitor over a specific length of time, thereby preventing those electrical pulses having less than a minimum amplitude integrated over time from effecting an electrical charge above a preselected value;
(e) a normally nonconducting transistor, connected with its emitter-to-collector circuit in parallel with the capacitor, which, when in a conductive state, acts to rapidly discharge said capacitor;
(f) a diode connected across the emitter-and-base terminals of the transistor, comprising means creating a voltage differential biasing the transistor and maintaining the transistor in a normally non-conducting state when voltage passes through the diode, but blocking any reversed flow of current, preventing any substantial drop in potential at the emitter of the transistor;
(g) a biasing resistor connected across the base-to-collector junction of the transistor and comprising means for permitting an accumulation of electric charge at the base of the transistor when current is caused to flow through the transistor's emitter-to-base junction and for causing the emitter-to-collector path to become conductive, thereby providing a discharge path to ground for the accumulated charge in the capacitor, further comprising a means for generating an electrical pulse of variable duration and magnitude;

(h) wherein said first means comprises means for electrically isolating each parallel load circuit, said means having a current control switch to regulate current flow within at least one of the load circuits in response to the applied electrical pulses, (i) further comprising means for applying power, to each parallel load circuit, of sufficient magnitude to actuate the respective associated load; and (j) means for controlling current flow through the respective associated loads in relation to the voltage transferred through the second, preventative means.

14. A circuit in accordance with claim 13, wherein said isolating means is an optical isolator which comprises:

(a) a current limiting resistor;

(b) a light emitting diode, connected in series with the limiting resistor, which is actuatable by the applied electrical pulses; and (c) a photosensitive switch which is actuatable by the light emitting diode and connected in a Darlington pair configuration to the base of a p-n-p transistor, through which the current flow of the isolated parallel load circuit is regulated.

15. A circuit in accordance with claim 14, wherein said load current control means comprises:

(a) a pair of p-n-p transistors connected in a Darlington pair configuration, each transistor having a biasing resistor connected across its emitter-to-base circuit; and (b) a reverse-biased diode connected in parallel to the Darlington pair transistors across the collector-to-emitter circuit of the transistors.

* * * * *